United States Patent [19]

Matsutani et al.

[11] 4,029,518

[45] June 14, 1977

[54] SOLAR CELL

[75] Inventors: Toshinobu Matsutani, Tenri; Keiichi Nishida, Yamatokoriyama, both of Japan

[73] Assignee: Sharp Kabushiki Kaisha, Osaka, Japan

[22] Filed: Nov. 20, 1975

[21] Appl. No.: 633,978

[30] Foreign Application Priority Data

Nov. 20, 1974 Japan .................... 49-141870[U]

[52] U.S. Cl. ............................ 136/89 SG; 357/30; 357/56; 357/65
[51] Int. Cl.² ................................. H01L 31/06
[58] Field of Search ............... 136/89; 357/20, 30, 357/56, 65, 68; 250/211 J

[56] References Cited

UNITED STATES PATENTS

| | | | |
|---|---|---|---|
| 2,196,830 | 4/1940 | Hewlett | 136/89 |
| 2,993,945 | 7/1961 | Huth | 136/89 |
| 3,053,926 | 9/1962 | Ben-Sira et al. | 136/89 |
| 3,094,439 | 6/1963 | Mann et al. | 136/89 |
| 3,682,708 | 8/1972 | Bennett | 136/89 |
| 3,802,924 | 4/1974 | Pschunder | 136/89 X |
| 3,904,453 | 9/1975 | Revesz et al. | 156/3 |
| 3,936,319 | 2/1976 | Anthony et al. | 136/89 |

FOREIGN PATENTS OR APPLICATIONS 4,531,141   1970   Japan ........................ 136/89

OTHER PUBLICATIONS

H. J. Hovel et al., "Method for Si and GaAs Solar Cell Diffusion," *IBM Tech. Disc. Bull.*, vol. 16, No. 7, pp. 2083–2084, Dec. 1973.
L. Forbes, "Photodiode Having Ion Implant For Improved Light Sensitivity," *IBM Tech. Disc. Bull.*, vol. 15, No. 4, p. 1348, Sept. 1972.

*Primary Examiner*—John H. Mack
*Assistant Examiner*—Aaron Weisstuch
*Attorney, Agent, or Firm*—Birch, Stewart, Kolasch & Birch

[57] ABSTRACT

A P-type diffusion layer is formed on an N-type silicon semiconductor wafer to establish a P-N junction in a solar cell, the diffusion layer being exposed to radiation. A pair of electrodes are formed on the surfaces of the diffusion layer and the semiconductor wafer in a desired configuration in order to provide output of electric energy generated by the solar cell. The diffusion layer is formed in such a manner that the layer has a thickness of around 3 μm at areas where the electrode is formed and has a thickness of around or below 0.5 μm at regions on which the electrode is not formed. With such an arrangement, radiation having a wavelength of about or shorter than 400 mμm can be used for performing optoelectric generation.

4 Claims, 3 Drawing Figures

SOLAR CELL

BACKGROUND OF THE INVENTION

The present invention relates to a solar cell.

In general, a solar cell has a semiconductor wafer of one conductivity type and a thin layer of conductivity type opposite to that of the semiconductor wafer. The thin layer is formed on the semiconductor wafer by doping or diffusing impurities into the semiconductor wafer to establish a P-N junction between the thin layer and the semiconductor wafer. Distortion of the crystal lattice is unavoidably formed in the thin diffusion layer when the impurities are diffused into the semiconductor wafer, which distortion acts as electron-hole recombination centers. Therefore, a great number of electron-hole pairs created by photons entering the diffusion thin layer are recombined at the said electron-hole recombination centers before they contribute to opto-electric conversion.

It will be clear that the opto-electric converting efficiency will be enhanced as the diffusion thin layer becomes thinner. But it is impossible to form the thin diffusion layer at a desired thickness, that is, for example, around 0.5 $\mu$m, because the P-N junction will be damaged when an electrode is formed on the very thin diffusion layer through the use of conventional heat treatment techniques.

Accordingly, an object of the present invention is to provide a solar cell having a high opto-electric converting efficiency.

Another object of the present invention is to provide a solar cell sensitive to radiation having very short wavelength.

Still another object of the present invention is to provide a solar cell having a thin diffusion layer suited for enhancing the opto-electric converting efficiency and preventing the P-N junction from being damaged.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objectives, pursuant to the present invention, a thin diffusion layer is formed in such a manner that the layer has a thickness of around 3 $\mu$m at areas where an electrode is formed and has a thickness of around or below 0.5 $\mu$m at regions where the electrode is not formed. With such an arrangement, radiation having a wavelength of about or shorter than 400 m$\mu$m can be used for performing optoelectric generation and, moreover, the P-N junction will not be damaged since the thin diffusion layer is formed to have a sufficient thickness, namely, of around 3 $\mu$m at the position where the electrode is formed.

BRIEF DESCRIPTION OF THE DRAWINGS

The present invention will become more fully understood from the detailed description given hereinbelow and from the accompanying drawings which are given by way of illustration only, and thus are not limitative of the present invention and wherein.

DESCRIPTION OF THE PREFERRED EMBODIMENTS

Figure 1:
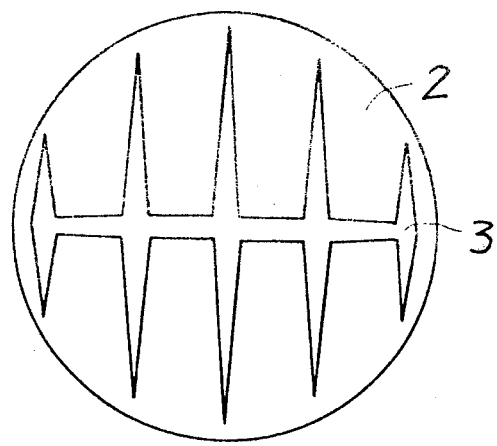
FIG. 1 is a plan view of an embodiment of a solar cell of the present invention.
Figure 2:
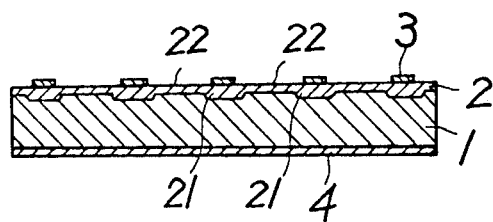
FIG. 2 is a cross sectional view of the solar cell of FIG. 1.

Referring now to FIGS. 1 and 2, there is illustrated an embodiment of a solar cell of the present invention which comprises an N-type silicon semiconductor wafer 1, a P-type diffusion layer 2, an electrode 3 formed on the diffusion layer 2 in a desired configuration and another electrode 4 uniformly formed on a rear surface of the semiconductor wafer 1.

The electrodes 3 and 4 are provided for collecting electric energy generated by the solar cell. The diffusion layer 2 is exposed to radiation and the electorde 3 mainly made of aluminum is formed in a desired configuration, for example, in a comb-shaped configuration. The N-type silicon semiconductor wafer 1 preferably has a diameter of 50 mm and a thickness of 300 $\mu$m-400 $\mu$m. The diffusion layer 2 is formed by doping, for example, boron, and is constructed to have a thickness of about 3 $\mu$m at areas 21 on which the electrode 3 is to be formed and have a thickness of around or below 0.5 $\mu$m at regions 22 on which the electrode 3 is not be formed.

With such an arrangement, radiation having a wavelenfth of [qound or shoqsdq th[n 400 m$\mu$m, which has a great tendency to be absorbed in the semiconductor layer, can reach a P-N junction barrier established between the N-type silicon semiconductor wafer 1 and the P-type diffusion layer 2 and/or can reach the N-type silicon semiconductor wafer, because the P-type diffusion layer 2 is very thin at the areas 22 on which the electrode 3 is not formed. Therefore, opto-electric converting efficiency will be considerably enhanced. Moreover, the P-N junction barrier will not be damaged during the fabrication of the electrode 3, because the diffusion layer 2 has a sufficient thickness at the areas 21 on which the electrode 3 is formed.

The variation of the thickness of the diffusion layer 2 can be formed in the following manner. First, the impurities are diffused under the condition where a mask is formed at desired positions on the N-type silicon semiconductor wafer 1 on which the electrode 3 is not to be formed. The impurities are again diffused uniformly after the mask is removed.

Figure 3:
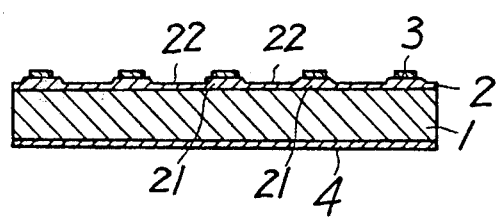
FIG. 3 is a cross sectional view of another embodiment of the present invention.

FIG. 3 shows another embodiment of the present invention. In this embodiment, the diffusion layer 2 is, at first, uniformly formed on the silicon semiconductor wafer 1 at a desired thickness, for example, 3 $\mu$m. After that, a mask is formed on the diffusion layer 2 in a desired configuration on which the electrode 3 is to be formed and, then the regions 22 on which the electrode 3 is not to be formed are slightly etched to a thickness of, for example, 0.5 $\mu$m. The crystal lattice is well-regulated in the diffusion layer 2 since the surface of the diffusion layer 2, which is damaged during the diffusion operation, is slightly etched.

The invention being thus described, it will be obvious that the same way be varied in many ways. Such variations are not to be regarded as a departure from the spirit and scope of the invention, and all such modifications are intended to be included within the scope of the following claims.

What is claimed is:

1. A solar cell comprising:

a semiconductor wafer of one conductivity type;

a diffusion layer of a conductivity type opposite to the conductivity type of the semiconductive wafer disposed on a first suface of said semiconductive wafer, said diffusion layer being formed on said first surface and having an etched surface providing thinner regions and thicker regions of a desired configuration;

a first electrode formed on a second surface of said semiconductor wafer opposite to said first surface; and a second electrode formed on said thicker regions of said diffusion layer.

2. The solar cell of claim 1, wherein the semiconductor wafer is an N-type silicon semiconductor wafer and the thin layer is a P-type diffusion layer.

3. The solar cell of claim 1, wherein the thicker regions of the diffusion layer have a thickness of about 3 $\mu$m and the other portions of the thin layer have a thickness of about 0.5 $\mu$m.

4. The solar cell of claim 1, wherein the thicker regions are comb-shaped.

* * * * *